United States Patent
Chiang et al.

(10) Patent No.: US 11,153,993 B2
(45) Date of Patent: Oct. 19, 2021

(54) SYSTEMS AND METHODS FOR PREVENTING AIRFLOW RECIRCULATION IN AN INFORMATION HANDLING SYSTEM AFTER AN AIR MOVER FAULT

(71) Applicant: Dell Products L.P., Round Rock, TX (US)

(72) Inventors: Hsing-Yu Chiang, Taipei (TW); Shih-Huai Cho, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 3 days.

(21) Appl. No.: 16/371,611

(22) Filed: Apr. 1, 2019

(65) Prior Publication Data

US 2020/0315068 A1    Oct. 1, 2020

(51) Int. Cl.
*H05K 7/20*    (2006.01)
*G06F 1/20*    (2006.01)

(52) U.S. Cl.
CPC ........... *H05K 7/20736* (2013.01); *G06F 1/20* (2013.01); *G06F 1/203* (2013.01)

(58) Field of Classification Search
CPC ....... F01D 17/141; F01D 17/143; F04D 25/14
See application file for complete search history.

(56) References Cited

U.S. PATENT DOCUMENTS

| 7,025,086 | B2 * | 4/2006 | Maeda | F04D 25/14 137/512.1 |
| 8,341,887 | B2 * | 1/2013 | Stone | E06B 9/26 49/74.1 |
| 2019/0257315 | A1 * | 8/2019 | Terraz | F24F 1/50 |

* cited by examiner

*Primary Examiner* — Woody A Lee, Jr.
*Assistant Examiner* — Brian O Peters
(74) *Attorney, Agent, or Firm* — Jackson Walker L.L.P.

(57) ABSTRACT

In an exhaust assembly, each particular louver of a plurality of louvers may be hingedly coupled to a generally circular bracket and may be arranged with respect to the air mover and each other such that in the presence of airflow generated by the air mover, the plurality of louvers rotate to an open position relative to the generally circular bracket under force of the airflow such that airflow passes freely through the exhaust assembly and in the absence of air flow generated by the air mover, at least one of the plurality of louvers rotates to a closed position relative to the generally circular bracket under force of gravity and mechanically interacts with a remainder of the plurality of louvers such that all of the plurality of louvers rotate to the closed position such that flow of air through the exhaust assembly is blocked by the plurality of louvers.

17 Claims, 11 Drawing Sheets

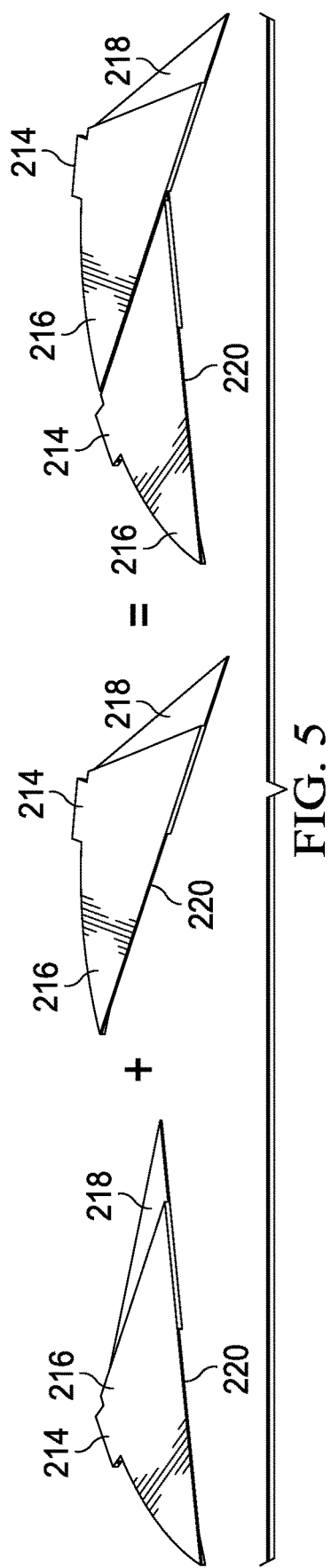

SYSTEMS AND METHODS FOR PREVENTING AIRFLOW RECIRCULATION IN AN INFORMATION HANDLING SYSTEM AFTER AN AIR MOVER FAULT

TECHNICAL FIELD

The present disclosure relates in general to information handling systems, and more particularly to preventing airflow recirculation in a system for cooling an information handling system and components thereof after occurrence of an air mover fault.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

Often, air movers are used in a redundant configuration in information handling systems, wherein a plurality of air movers are installed, configured, and arranged such that in case of a fault of one air mover, the remaining air movers may be sufficient to meet the cooling needs of the information handling system. However, during an air mover fault, it may be necessary to reduce recirculation of air by reducing or eliminating passage of air through the exhaust of a failed or faulted air mover.

SUMMARY

In accordance with the teachings of the present disclosure, the disadvantages and problems associated with airflow recirculation in a cooling system of an information handling system and components thereof may be substantially reduced or eliminated.

In accordance with embodiments of the present disclosure, an air mover assembly may comprise an air mover and an exhaust assembly mechanically coupled to the air mover. The exhaust assembly may include a generally circular bracket and a plurality of louvers, each particular louver mechanically coupled to the generally circular bracket via a respective hinge of the particular louver. The plurality of louvers may be arranged with respect to the air mover and each other such that in the presence of airflow generated by the air mover, the plurality of louvers rotate to an open position relative to the generally circular bracket under force of the airflow such that airflow passes freely through the exhaust assembly and in the absence of air flow generated by the air mover, at least one of the plurality of louvers rotates to a closed position relative to the generally circular bracket under force of gravity and mechanically interacts with a remainder of the plurality of louvers such that all of the plurality of louvers rotate to the closed position such that flow of air through the exhaust assembly is blocked by the plurality of louvers.

In accordance with these and other embodiments of the present disclosure, an information handling system may include a chassis and an air mover assembly coupled to the chassis. The air mover assembly may comprise an air mover and an exhaust assembly mechanically coupled to the air mover. The exhaust assembly may include a generally circular bracket and a plurality of louvers, each particular louver mechanically coupled to the generally circular bracket via a respective hinge of the particular louver. The plurality of louvers may be arranged with respect to the air mover and each other such that in the presence of airflow generated by the air mover, the plurality of louvers rotate to an open position relative to the generally circular bracket under force of the airflow such that airflow passes freely through the exhaust assembly and in the absence of air flow generated by the air mover, at least one of the plurality of louvers rotates to a closed position relative to the generally circular bracket under force of gravity and mechanically interacts with a remainder of the plurality of louvers such that all of the plurality of louvers rotate to the closed position such that flow of air through the exhaust assembly is blocked by the plurality of louvers.

In accordance with these and other embodiments of the present disclosure, an exhaust assembly configured to be mechanically coupled to an air mover may include a generally circular bracket and a plurality of louvers, each particular louver mechanically coupled to the generally circular bracket via a respective hinge of the particular louver. The plurality of louvers may be arranged with respect to the air mover and each other such that in the presence of airflow generated by the air mover, the plurality of louvers rotate to an open position relative to the generally circular bracket under force of the airflow such that airflow passes freely through the exhaust assembly and in the absence of air flow generated by the air mover, at least one of the plurality of louvers rotates to a closed position relative to the generally circular bracket under force of gravity and mechanically interacts with a remainder of the plurality of louvers such that all of the plurality of louvers rotate to the closed position such that flow of air through the exhaust assembly is blocked by the plurality of louvers.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 5 illustrates a perspective isometric schematic view depicting mechanical interaction between adjacent louvers, in accordance with the present disclosure;

DETAILED DESCRIPTION

Preferred embodiments and their advantages are best understood by reference to FIGS. 1-8B, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

Figure 1:
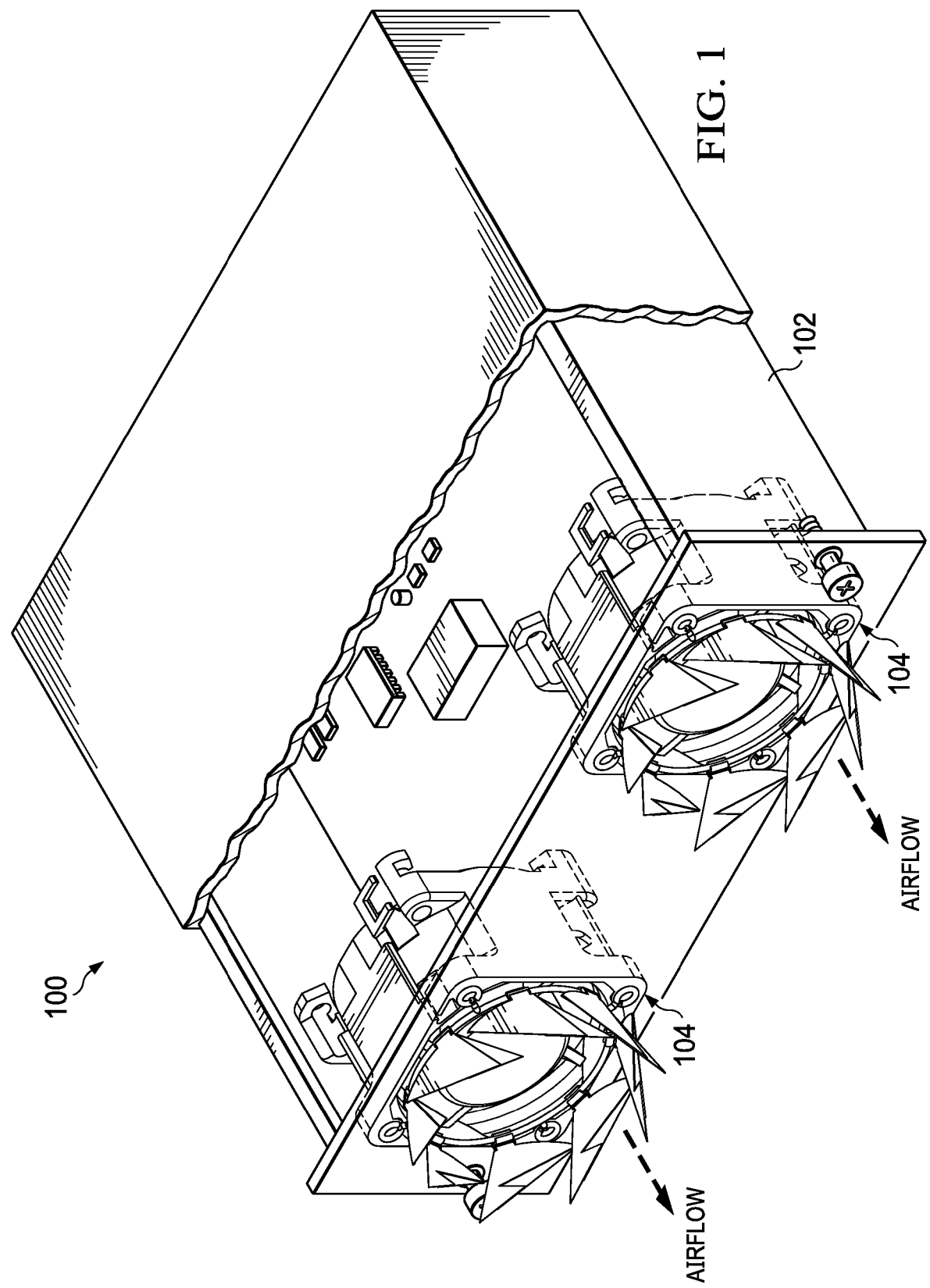
FIG. 1 illustrates a block diagram of an example information handling system having one or more air mover assemblies for cooling information handling resources, in accordance with the present disclosure.

FIG. 1 illustrates a block diagram of an example information handling system 100 having one or more air mover assemblies 104 for cooling information handling resources of information handling system 100, in accordance with the present disclosure. In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data.

As depicted in FIG. 1, information handling system 100 may include a chassis 102 having a plurality of air mover assemblies 104. Chassis 102 may be an enclosure that serves as a container for various information handling resources of information handling system 100, and may be constructed from steel, aluminum, plastic, and/or any other suitable material. Although the term "chassis" is used, chassis 102 may also be referred to as a case, cabinet, tower, box, enclosure, and/or housing.

Each of air mover assemblies 104 may be any mechanical or electro-mechanical system, apparatus, or device operable to move air and/or other gases. In certain embodiments, air mover assemblies 104 may draw cool air into chassis 102 from the outside, expel warm air from inside chassis 102, and/or move air across one or more heatsinks (not explicitly shown) internal to chassis 102 to cool one or more information handling resources of information handling system 100. The structure and function of air mover assemblies 104 may be described in greater detail below with respect to FIGS. 2, 3, 4A, 4B, 5, 6A, 6B, 7A, 7B, 8A, and 8B.

Although information handling system 100 is depicted as including two air mover assemblies 104, information handling system 100 may include any number of air mover assemblies 104. In addition, although a particular configuration of air mover assemblies 104 is depicted, air mover assemblies 104 may be configured in any suitable manner.

Figure 2:
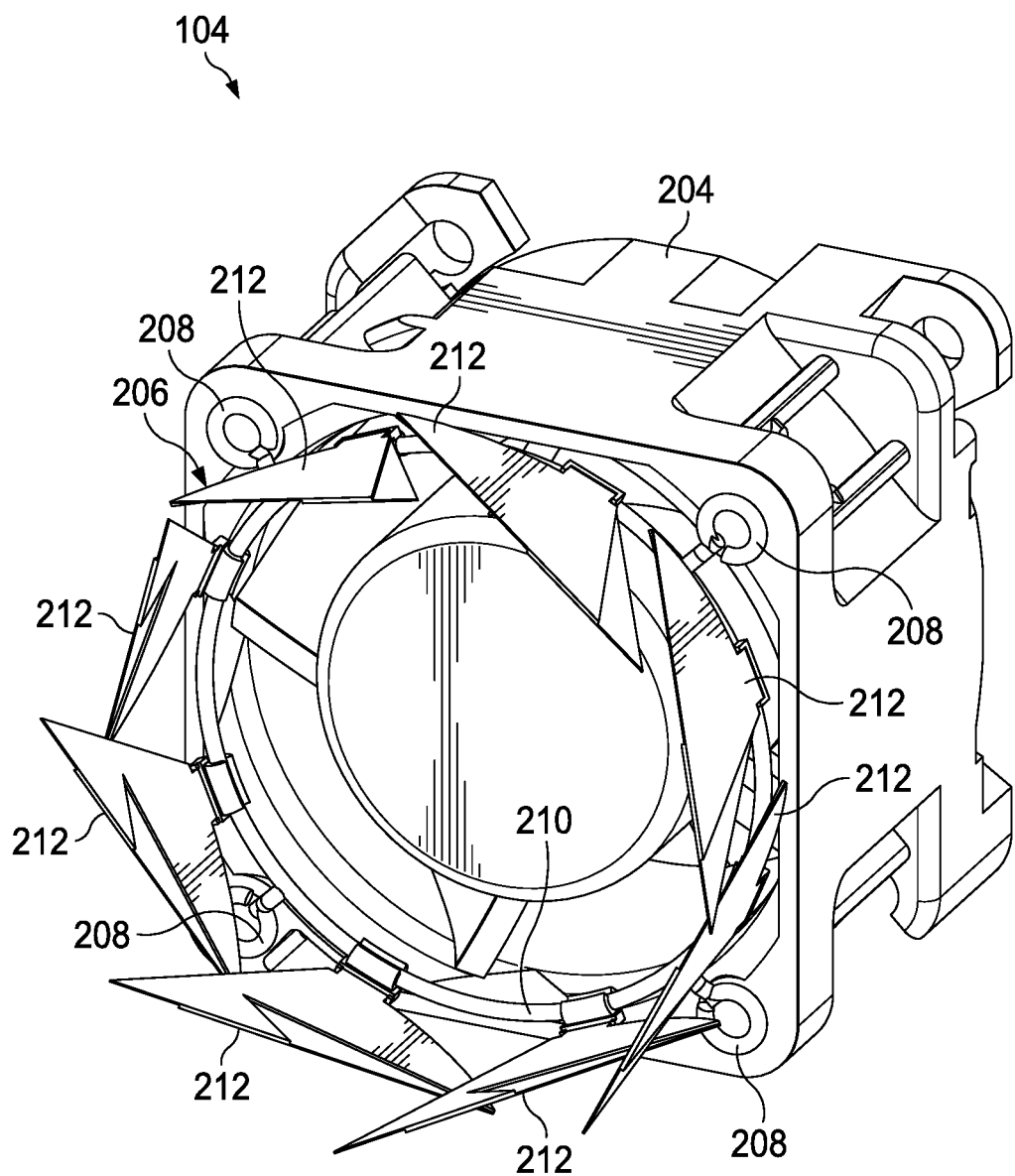
FIG. 2 illustrates a perspective isometric schematic view of an example air mover assembly, in accordance with the present disclosure.

FIG. 2 illustrates a perspective isometric schematic view of example air mover assembly 104, in accordance with the present disclosure. In particular, FIG. 2 illustrates a perspective view of air mover assembly 104 mainly depicting an exhaust portion of example air mover assembly 104. As shown in FIG. 2, air mover assembly 104 may include air mover 204 and an exhaust assembly 206 mechanically coupled to air mover 204. Exhaust assembly 206 may be configured to mechanically couple to air mover 204 (e.g., via attachment features 208, one or more flanges, one or more fasteners, and/or one or more openings configured to receive fasteners), and may include openings, features, or other structures configured to guide or direct air exhausted by air mover assembly 104 (e.g., guide air externally to chassis 102). Exhaust assembly 206 may be constructed from steel, aluminum, plastic, any other suitable material, and/or a combination thereof. As shown in FIG. 2, air mover 204 may be mounted to exhaust assembly 206 (e.g., via one or more flanges, one or more fasteners, and/or one or more openings configured to receive fasteners) such that when in operation, air mover 204 draws air into air mover 204 and exhausts such air externally to chassis 102 through exhaust assembly 206.

Figure 3:
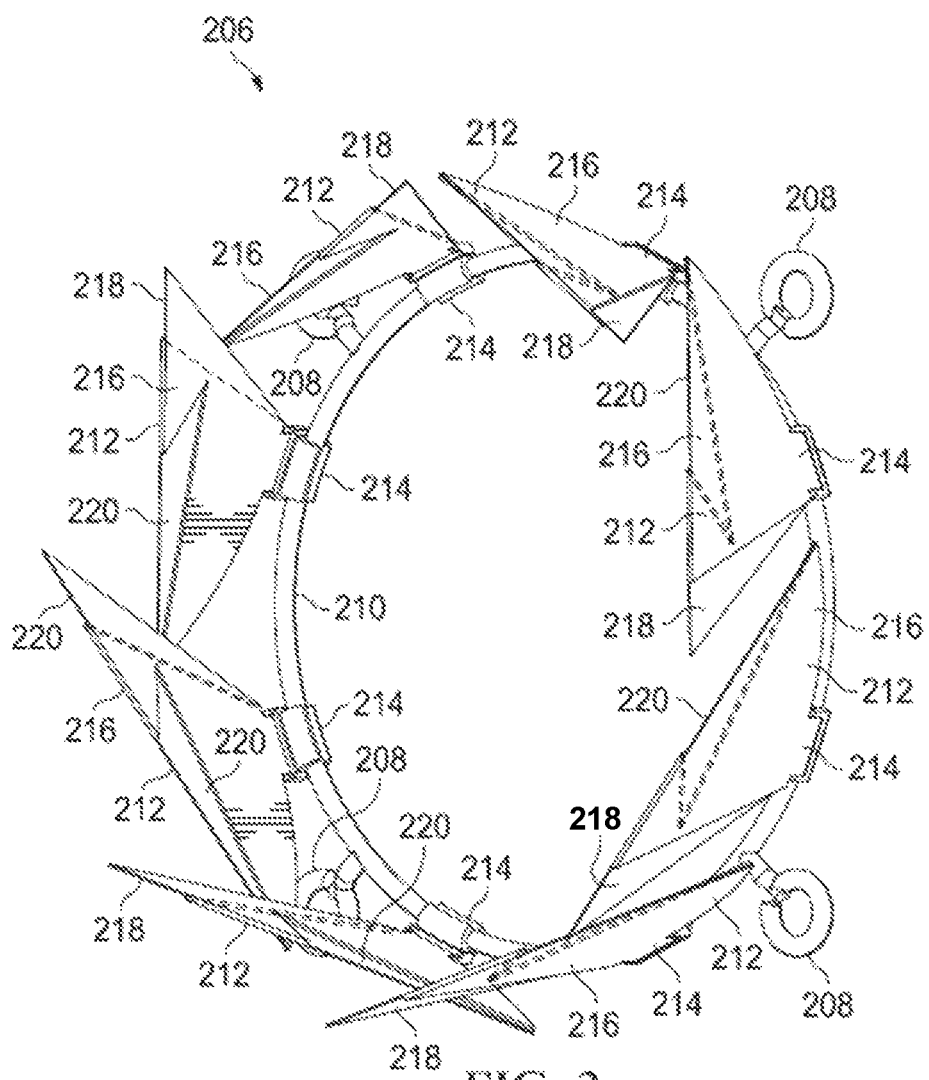
FIG. 3 illustrates a perspective isometric schematic view of an example exhaust assembly, in accordance with the present disclosure.

FIG. 3 illustrates a perspective isometric schematic view of an example exhaust assembly 206, in accordance with the present disclosure. As shown in FIGS. 2 and 3, exhaust assembly 206 may include a plurality of attachment features 208 to mechanically couple exhaust assembly 206 to air mover 204, a generally circular bracket 210 mechanically coupled to attachment features 208, and a plurality of louvers 212 each mechanically coupled to bracket 210 via a respective hinge 214 of each louver 212.

Figure 4A:
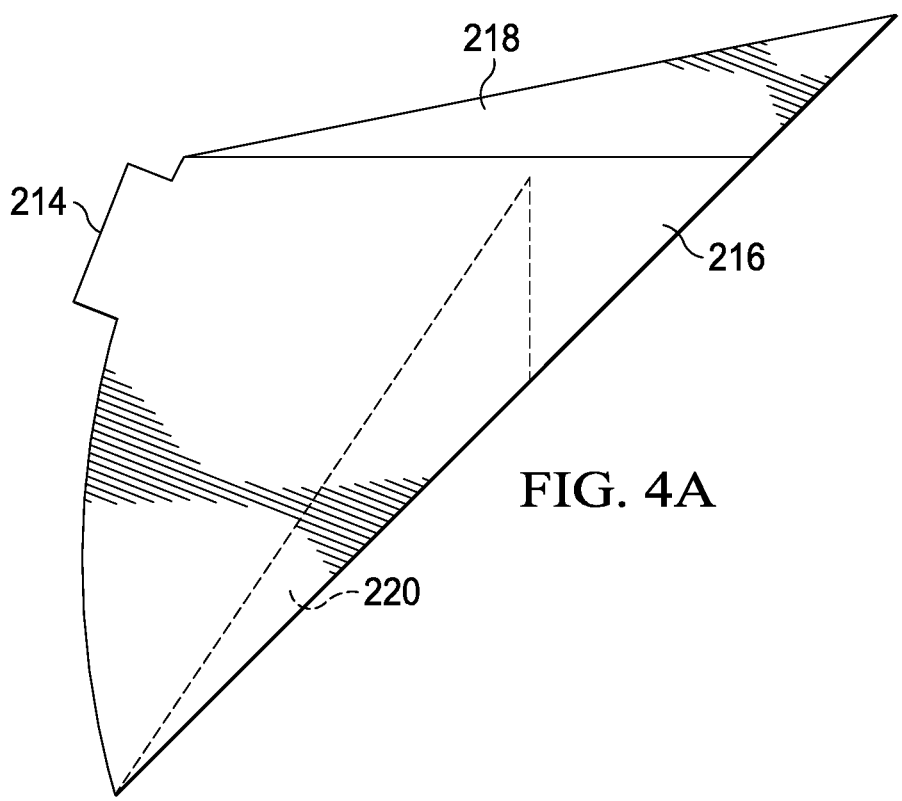
FIGS. 4A and 4B illustrate various schematic views of an example louver of an exhaust assembly, in accordance with the present disclosure.
Figure 4B:
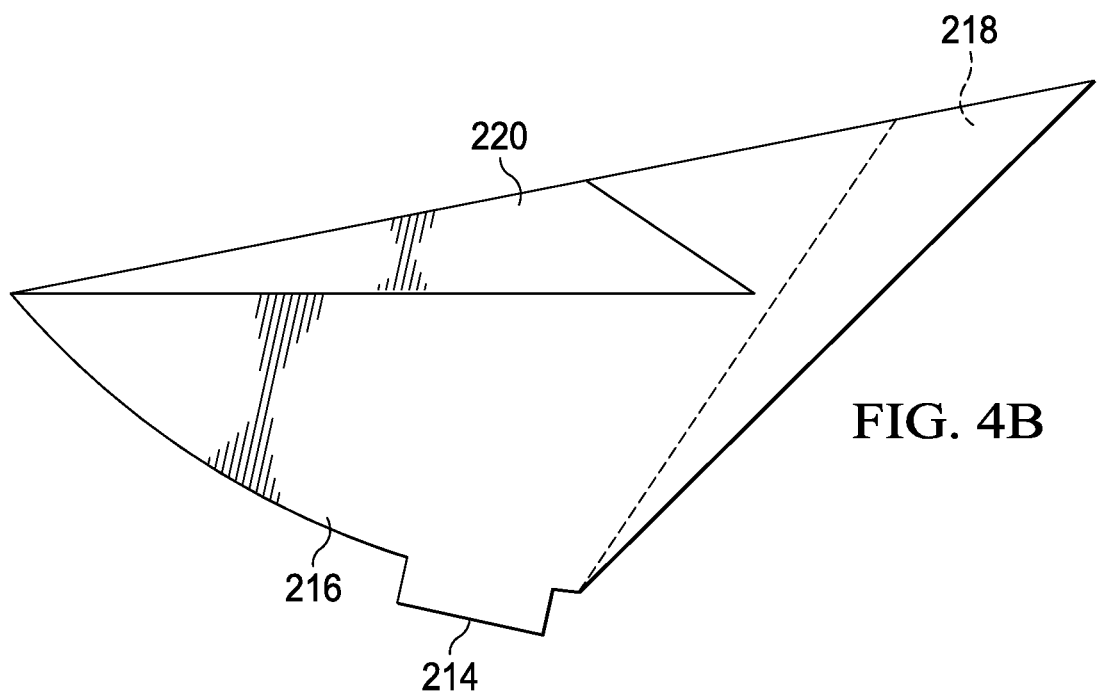

FIGS. 4A and 4B illustrate various schematic views of an example louver 212 of exhaust assembly 206, in accordance with the present disclosure. FIG. 4A illustrates a top side of louver 212 while FIG. 4B illustrates a bottom side of louver 212. As shown in FIGS. 3, 4A, and 4B, louver 212 may have a hinge 214, a first body portion 216, and a second body portion 218. First body portion 216 may be fixedly coupled to hinge 214 and have a generally triangular shape. In some embodiments, first body portion 216 and hinge 214 may be a single continuous piece of material. Second body portion 218 may be fixedly coupled to first body portion 216 and have a generally triangular shape. Also as shown in FIGS. 3 and 4B, first body portion 216 may have an engagement feature 220 formed within the bottom side of louver 212, such engagement feature 220 shaped to receive a second body portion 218 of another adjacent louver 212. Thus, as described in greater detail below, when louvers 212 of exhaust assembly 206 are in a closed position, an engagement feature 220 of a first louver 212 may receive a second body portion 218 of a second lover 212 adjacent to first louver 212. FIG. 5 illustrates a perspective isometric schematic view depicting mechanical interaction between adjacent louvers 212 in a closed position of louvers 212, in accordance with the present disclosure.

Figure 6A:
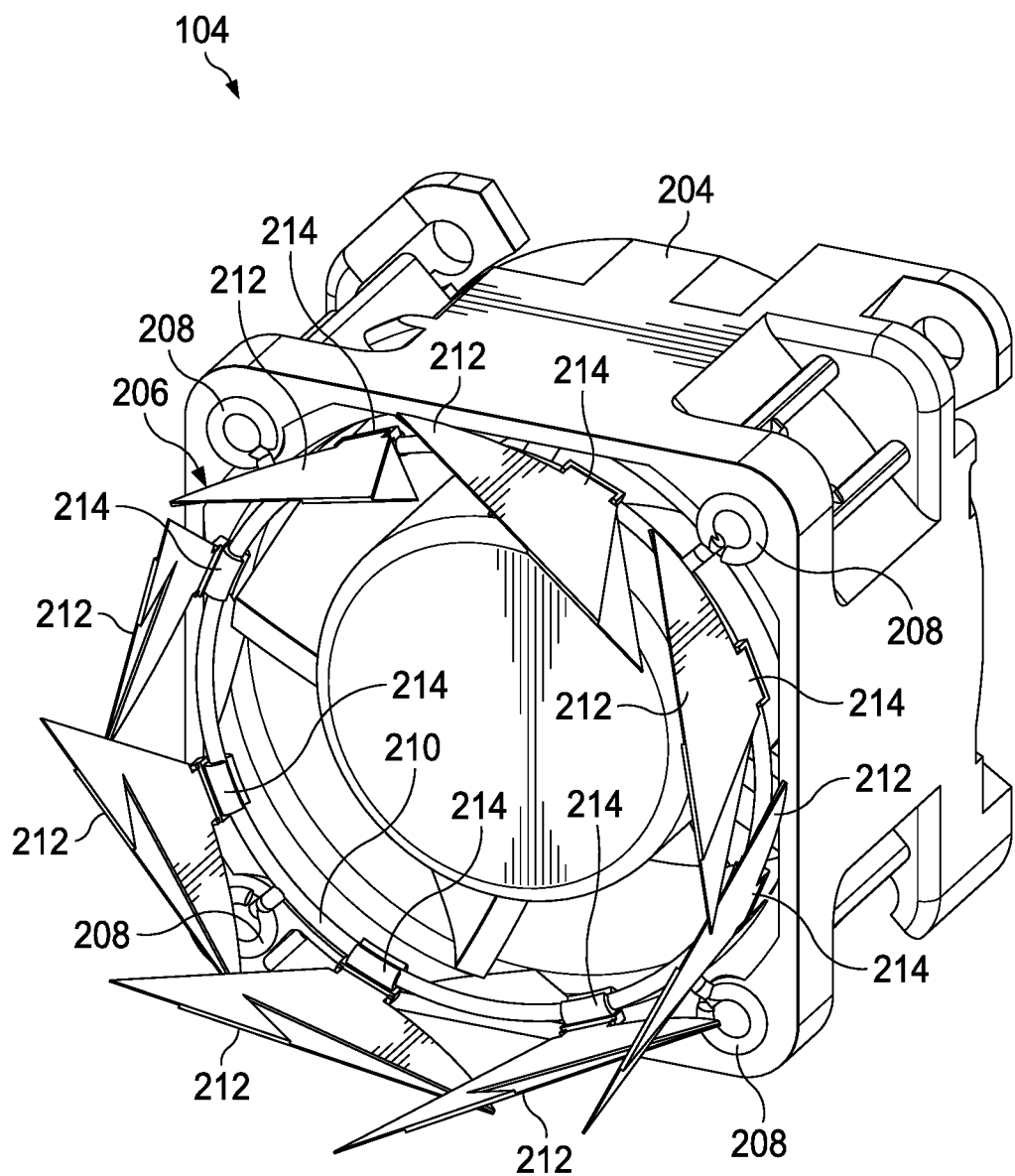
FIGS. 6A and 6B illustrate various schematic views of an example air mover assembly with louvers in an open position, in accordance with the present disclosure.
Figure 6B:
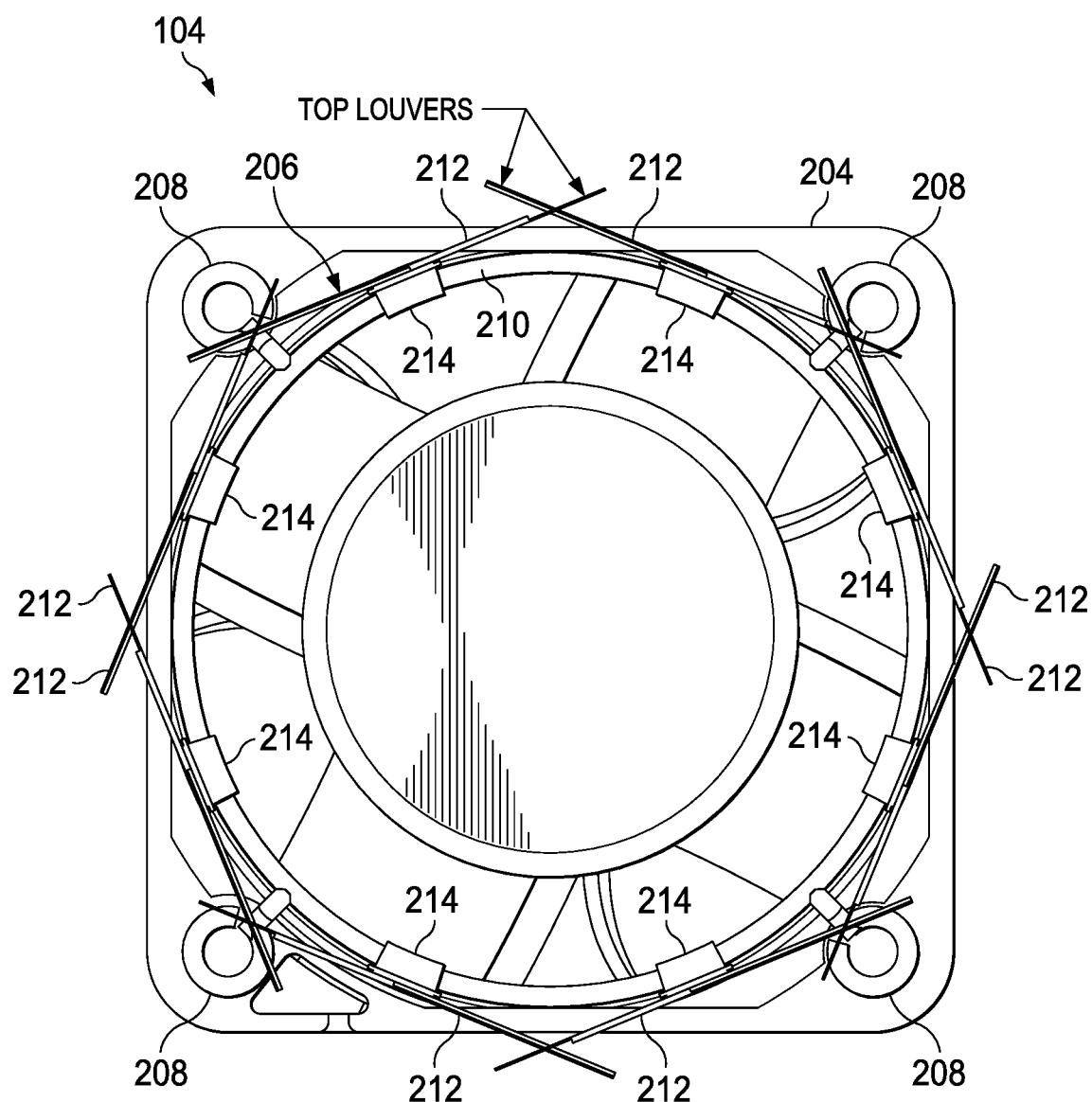
Figure 7A:
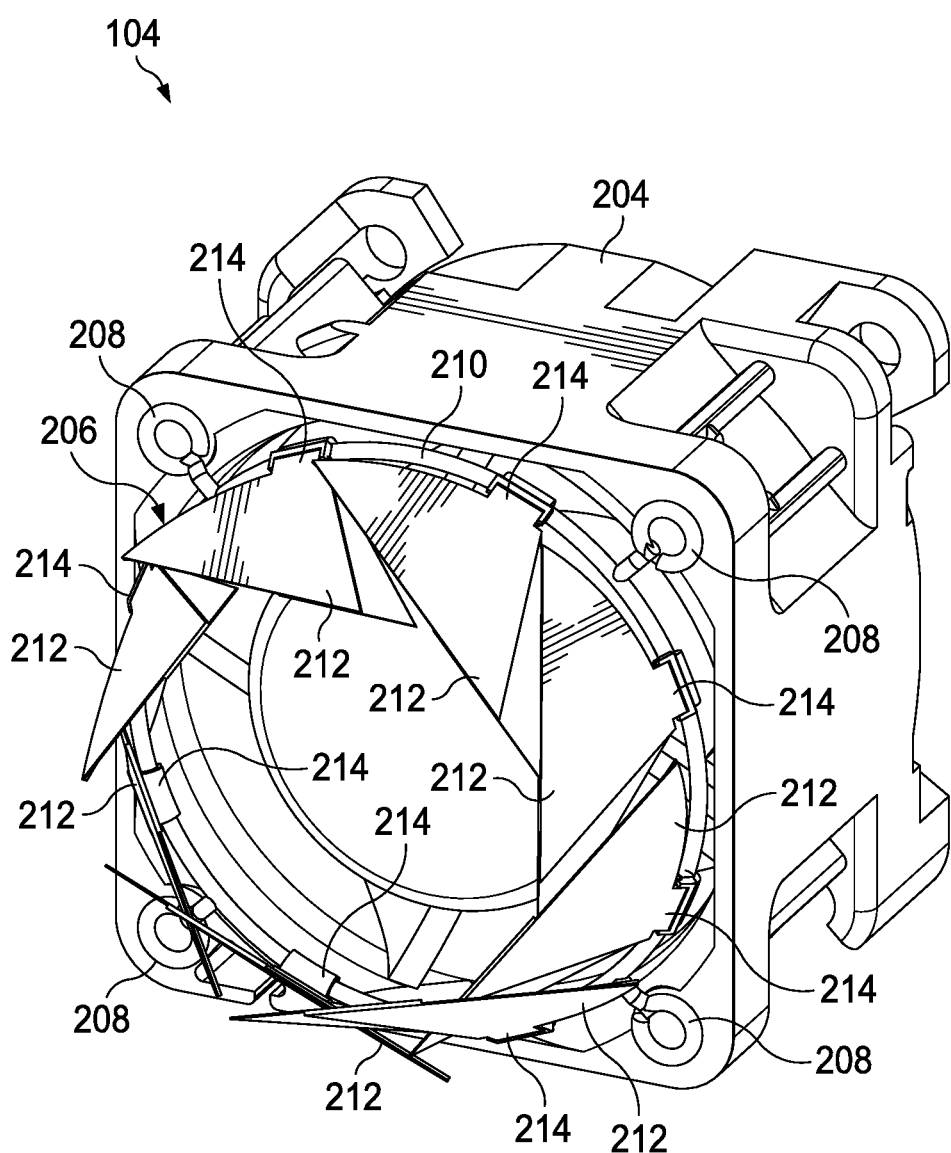
FIGS. 7A and 7B illustrate various schematic views of an example air mover assembly with louvers in a partially-closed position, in accordance with the present disclosure.
Figure 7B:
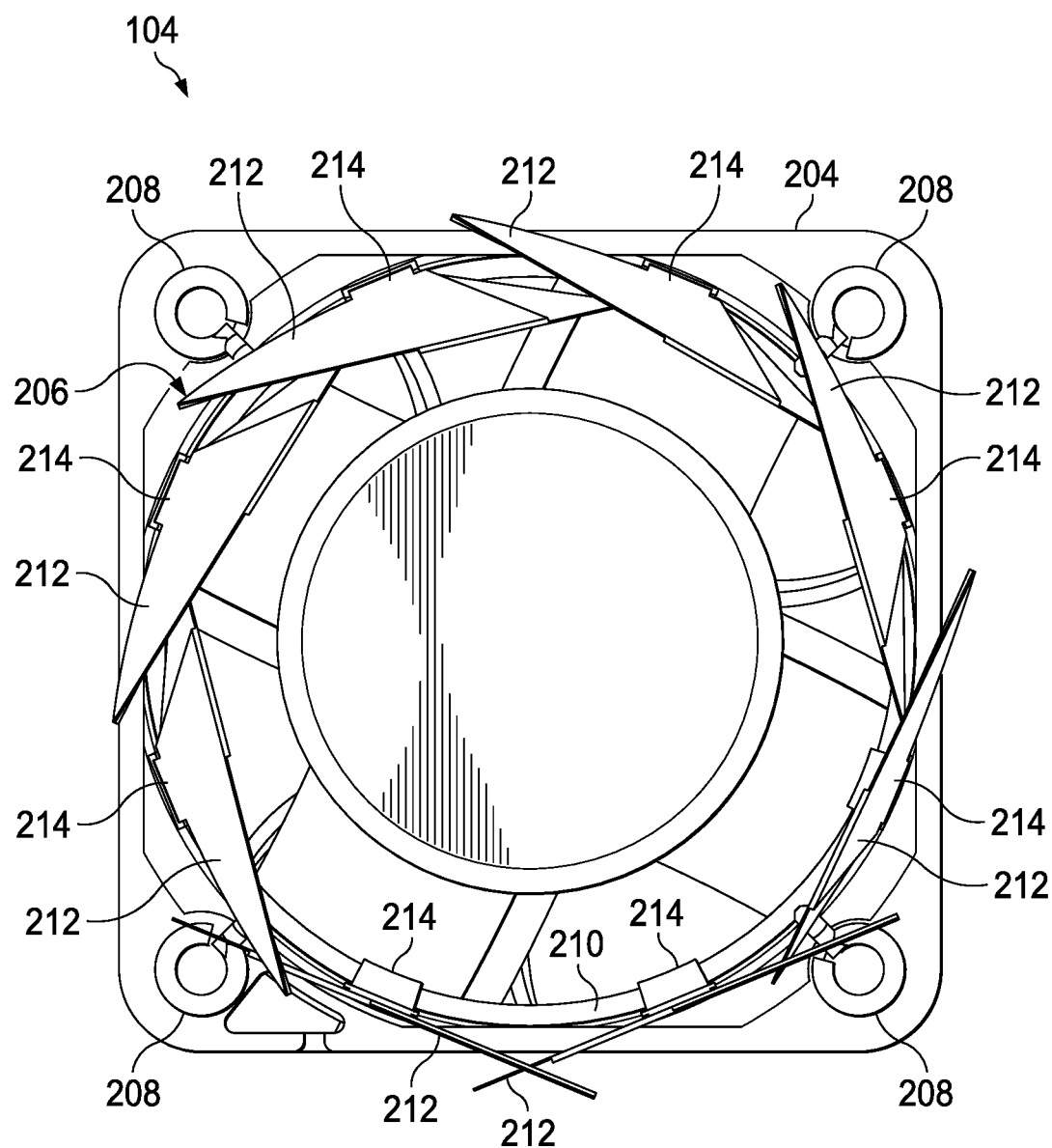
Figure 8A:
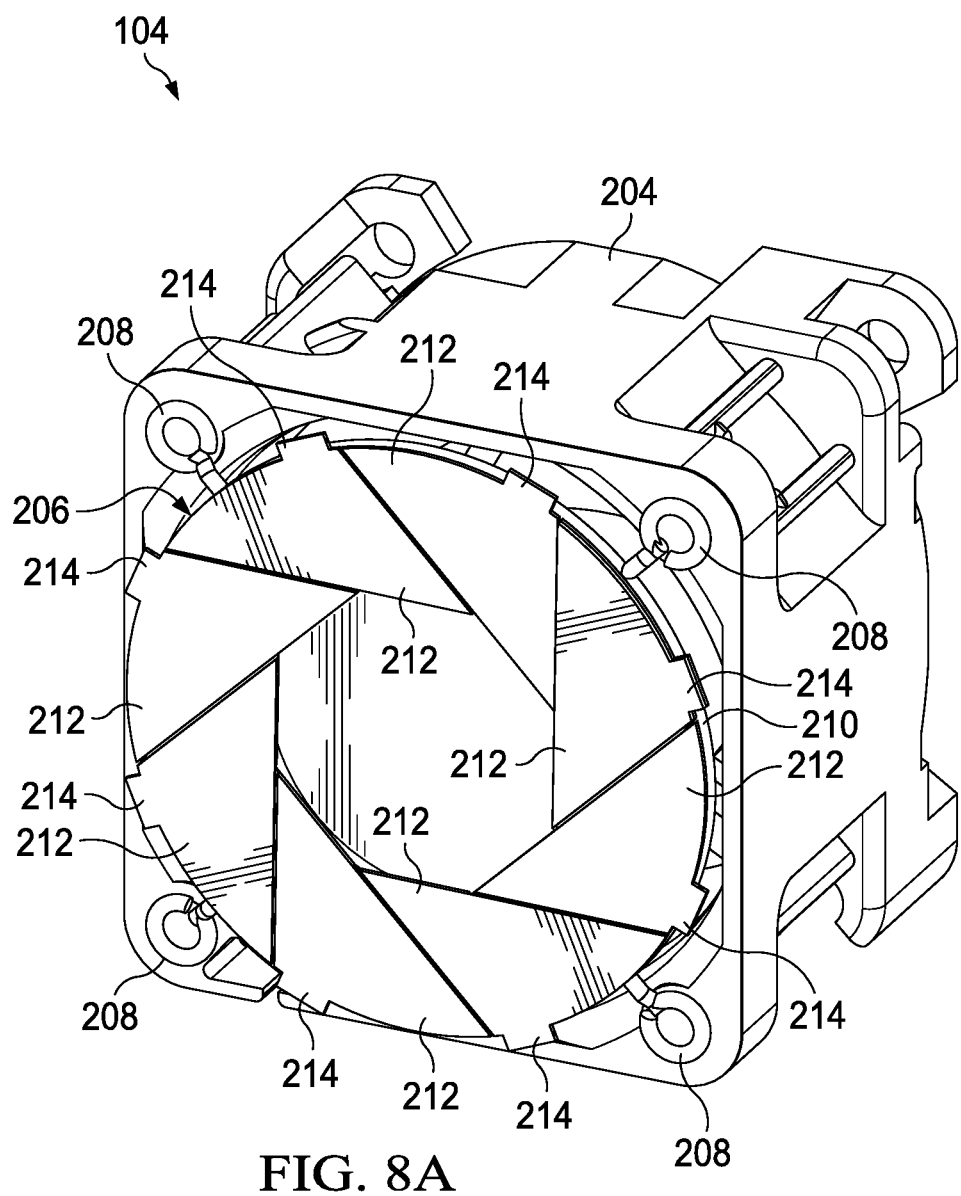
FIGS. 8A and 8B illustrate various schematic views of an example air mover assembly with louvers in a closed position, in accordance with the present disclosure.
Figure 8B:
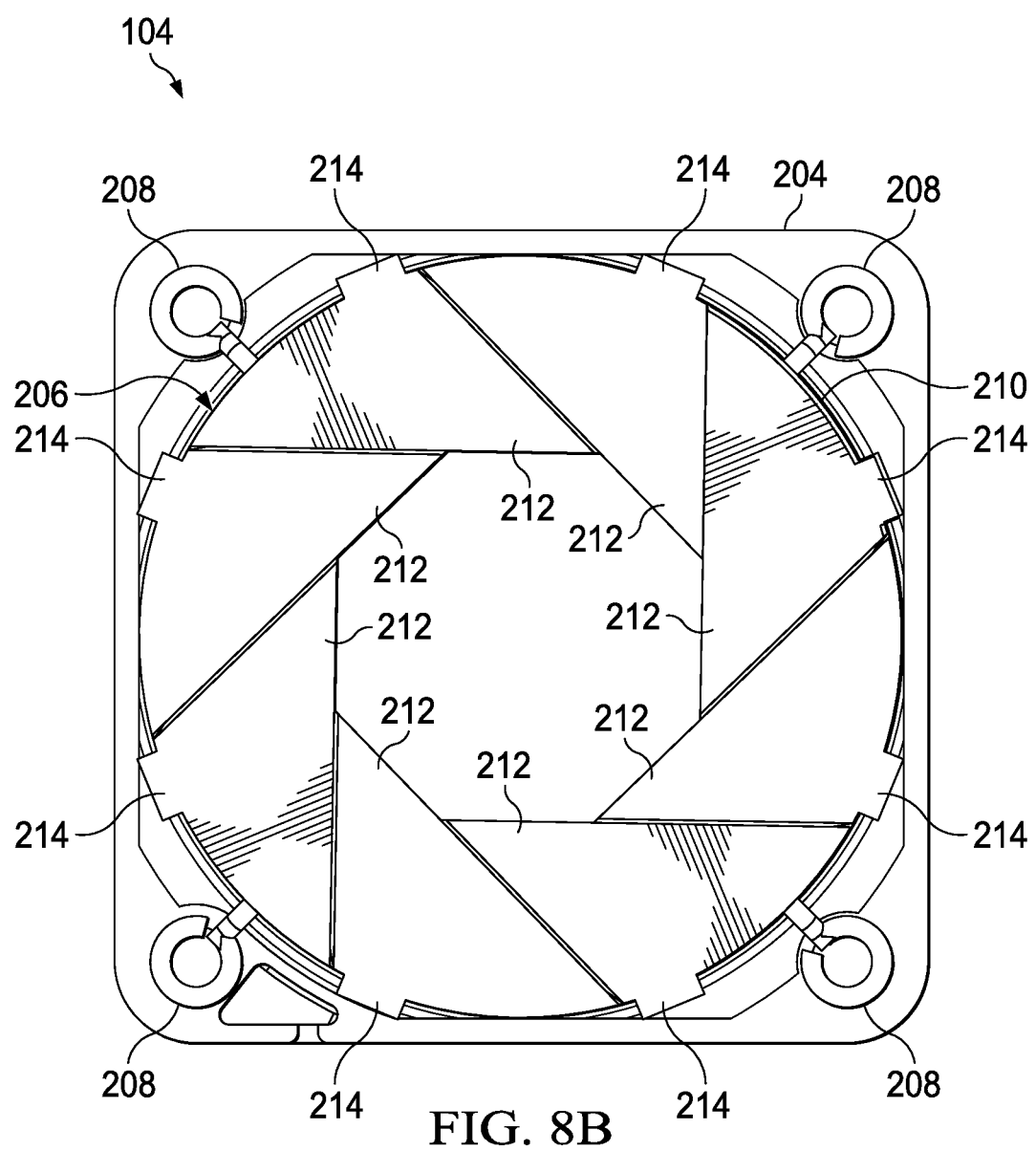

FIGS. 6A and 6B illustrate various schematic views of air mover assembly 104 with louvers 212 in an open position, in accordance with the present disclosure. Louvers 212 may be in the open position when air mover 204 is operational and driving a flow of air, as the force of pressure of such airflow on louvers 212 may overcome any gravitational force upon louvers 212 and thus force louvers 212 into the open position. However, in the absence of air flow due to a fault or failure of air mover 204, the force of gravity upon one or more louvers at the top of exhaust assembly 206 (e.g., labeled as "TOP LOUVERS" in FIG. 6B), may cause such louvers 212 to rotate relative to bracket 210 via hinge 214 in a generally downward direction (e.g., rotate from a position in which a plane defined by a surface of louver 212 is parallel to a direction of air flow to a position in which such plane is perpendicular to the direction of air flow). In turn, mechanical interaction of a first body portion 216 of a top louver 212 with a second body portion 218 of an adjacent louver 212 may also cause such adjacent louver 212 to similarly rotate relative to bracket 210 via the respective hinge 214 of such adjacent louver 212. In turn, such adjacent louver 212 may similarly interact with an additional louver 212 adjacent to such adjacent louver 212, causing the additional louver 212 to similarly rotate relative to bracket 210 via the respective hinge 214 of such additional louver 212, and so on. Accordingly, when an air mover fault or failure occurs, the force of gravity on one or more louvers 212 may cause louvers 212 to mechanically interact with one another such that louvers 212 translate from an open position in which louvers 212 allow airflow to pass through air mover 204, through a partially-closed position depicted in FIGS. 7A and 7B, to a fully-closed position depicted in FIGS. 8A and 8B, in which louvers 212 close the exhaust of air mover 204, preventing airflow, including recirculation, through air mover 204.

In addition, due to the arrangement of mechanically interacting louvers 212, as long as air mover 204 is oriented such that the air flow it generates is perpendicular to the direction of gravity, an orientation of air mover assembly 104 may be changed (e.g., information handling system 100 comprising air mover assembly 104 may be rotated 90 degrees from a tower orientation to a rack orientation, or vice versa), and the force of gravity may still act on one or more louvers 212 to allow louvers 212 to move to the closed position in the absence of airflow. Accordingly, the orientation of air mover 204 may be changed from the first position to the second position (or vice versa), while still allowing louvers 212 to assume the closed position under the force of gravity when air mover 204 is not operational, and to assume the open position when air mover 204 is operational.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An air mover assembly comprising:
   an air mover; and
   an exhaust assembly mechanically coupled to the air mover and comprising:
   a generally circular bracket; and
   a plurality of louvers, each particular louver mechanically coupled to the generally circular bracket via a respective hinge of the particular louver, wherein each particular louver includes a generally triangular first portion partially overlying a generally triangular second portion and wherein the first portion extends to a first distal corner positioned on a first side of the hinge and the second portion extends to a second distal corner on a second side of the hinge wherein the first distal corner is closer to the generally circular bracket and farther from the hinge than the second distal corner.

2. The air mover assembly of claim 1, wherein the first distal corner of each louver is positioned in closed proximity to the hinge of an adjacent louver when the louvres are in the closed position.

3. The air mover assembly of claim 2, wherein for each particular louver of the plurality of louvers, the first body portion of the louver includes a recess suitable for receiving the second body portion of an adjacent louver of the plurality of louvers.

4. The air mover assembly of claim 3, wherein the recess defines a corner and wherein the second distal corner of an adjacent louver is received in the corner of the recess when the louvers are in the closed position.

5. The air mover assembly of claim 2, wherein dimensions of the recess are equivalent to dimensions of a part of each second body portion not underlying the first body portion.

6. The air mover assembly of claim 1, wherein each louver includes a distal edge opposite the hinge, wherein the distal edge includes a distal edge of the first body portion and a distal edge of second body portion.

7. An information handling system comprising:
   a chassis; and
   an air mover assembly coupled to the chassis and comprising:
   an air mover; and
   an exhaust assembly mechanically coupled to the air mover and comprising:
   a generally circular bracket; and
   a plurality of louvers, each particular louver mechanically coupled to the generally circular bracket via a respective hinge of the particular louver, wherein each particular louver includes a generally triangular first portion partially overlying a generally triangular second portion and wherein the first portion extends to a first distal corner positioned on a first side of the hinge and the second portion extends to a second distal corner on a second side of the hinge wherein the first distal corner is closer to the generally circular bracket and farther from the hinge than the second distal corner.

8. The information handling system of claim 7, wherein the first distal corner of each louver is positioned in closed proximity to the hinge of an adjacent louver when the louvres are in the closed position.

9. The information handling system of claim 8, wherein for each particular louver of the plurality of louvers, the first body portion of the louver includes a recess suitable for receiving the second body portion of an adjacent louver of the plurality of louvers.

10. The information handling system of claim 9, wherein the recess defines a corner and wherein the second distal corner of an adjacent louver is received in the corner of the recess when the louvers are in the closed position.

11. The information handling system of claim 8, wherein dimensions of the recess are equivalent to dimensions of a part of each second body portion not underlying the first body portion.

12. The information handling system of claim 8, wherein each louver includes a distal edge opposite the hinge, wherein the distal edge includes a distal edge of the first body portion and a distal edge of second body portion.

13. An exhaust assembly configured to be mechanically coupled to an air mover, the exhaust assembly comprising:
   a generally circular bracket; and
   a plurality of louvers, each particular louver mechanically coupled to the generally circular bracket via a respective hinge of the particular louver, wherein each particular louver includes a generally triangular first portion partially overlying a generally triangular second portion and wherein the first portion extends to a first distal corner positioned on a first side of the hinge and the second portion extends to a second distal corner on a second side of the hinge wherein the first distal corner is closer to the generally circular bracket and farther from the hinge than the second distal corner.

14. The exhaust assembly of claim 13, wherein the first distal corner of each louver is positioned in closed proximity to the hinge of an adjacent louver when the louvres are in the closed position.

15. The exhaust assembly of claim 14, wherein for each particular louver of the plurality of louvers, the first body portion of the louver includes a recess suitable for receiving the second body portion of an adjacent louver of the plurality of louvers.

16. The exhaust assembly of claim 15, wherein the recess defines a corner and wherein the second distal corner of an adjacent louver is received in the corner of the recess when the louvers are in the closed position.

17. The exhaust assembly of claim 14, wherein dimensions of the recess are equivalent to dimensions of a part of each second body portion not underlying the first body portion.

* * * * *